United States Patent [19]

Moskovits

[11] Patent Number: 5,202,290
[45] Date of Patent: Apr. 13, 1993

[54] PROCESS FOR MANUFACTURE OF QUANTUM DOT AND QUANTUM WIRE SEMICONDUCTORS

[76] Inventor: Martin Moskovits, 145 Chiltern Hill Road, Toronto, Ontario, Canada, M5C 3C3

[21] Appl. No.: 801,404

[22] Filed: Dec. 2, 1991

[51] Int. Cl.$^5$ ............... H01L 21/00; H01L 21/02; H01L 21/20; H01L 21/205
[52] U.S. Cl. .................. 437/233; 437/234; 437/967; 437/98; 437/99; 148/DIG. 122
[58] Field of Search ............ 427/99, 96, 98; 437/225, 228, 233, 234, 967; 148/DIG. 122

[56] References Cited

U.S. PATENT DOCUMENTS

| | | | |
|---|---|---|---|
| 4,472,533 | 9/1984 | Moskovits | 502/320 |
| 4,575,924 | 3/1986 | Reed et al. | 437/105 |
| 4,751,200 | 6/1988 | Gmitter et al. | 437/225 |
| 4,783,427 | 11/1988 | Reed et al. | 437/133 |
| 4,808,279 | 2/1989 | Moskovits | 204/8 |
| 4,843,037 | 6/1989 | Yablonovitch et al. | 437/235 |
| 4,987,094 | 1/1991 | Colas et al. | 437/946 |
| 5,013,683 | 5/1991 | Petroff et al. | 437/936 |
| 5,096,846 | 3/1992 | Randall | 437/189 |
| 5,104,824 | 4/1992 | Clausen, Jr. et al. | 437/90 |

FOREIGN PATENT DOCUMENTS

| | | |
|---|---|---|
| 0003222 | 1/1990 | Japan . |
| 0033972 | 2/1990 | Japan . |
| 0128435 | 5/1990 | Japan . |
| 0180821 | 8/1991 | Japan . |

OTHER PUBLICATIONS

Randall et al., "Advances in the Processing of Quantum Coupled Devices", SPIE, vol. 1284, (1990) pp. 66–74.

*Primary Examiner*—Brian E. Hearn
*Assistant Examiner*—B. Everhart
*Attorney, Agent, or Firm*—Ridout & Maybee

[57] ABSTRACT

Quantum dot and quantum wire semiconductors in the nanosize range are produced by a process which utilizes a microporous aluminum oxide surface layer on an aluminum metal substrate as a template for the semiconducting material. The microporous surface layer is prepared by anodizing an aluminum substrate in an acid bath. Then a metal capable of forming a semiconductor compound is electrodeposited into the surface micropores, the oxide is partially or wholly etched away, and the deposited metal is reacted with a liquid or gaseous reagent to convert it chemically to a semiconducting compound. By the process of the invention, there are produced quantum dot or quantum wire semiconductors in the form of an array of substantially mutually parallel, substantially uniform-sized rods of semiconductor material protruding from an electrically conductive substrate, each rod having a diameter less than 100 nanometers.

14 Claims, 1 Drawing Sheet

PROCESS FOR MANUFACTURE OF QUANTUM DOT AND QUANTUM WIRE SEMICONDUCTORS

FIELD OF THE INVENTION

This invention relates to nanoparticulate metals and semiconductors and processes for their preparation. More particularly, it relates to structures of metals and semiconductors exhibiting quantum confinement characteristics, in the nanometer dimension range, for use in various electronic applications, and processes for their manufacture.

BACKGROUND OF THE INVENTION

It has become recognized in recent years that the electronic and optical properties of metals and semiconductors change dramatically as the particulates of the materials are reduced to approach the nanometer size range of dimensions. At such size levels, the physical dimensions of the material may have a critical effect on the electronic or optical behaviour of the material. The restriction of the electronic wave function to smaller and smaller regions of space within a particle of material (the resonance cavity) is referred to as "quantum confinement". Semiconductor structures in the nanometer size range, exhibiting the characteristics of quantum confinement, are commonly referred to as "quantum dots" when the confinement is in three dimensions, "quantum wires" when the confinement is in two dimensions, and "quantum wells" when the confinement is in one dimension.

By the term "nanometer size range" as it is used herein, there is meant a size range from about 1-500 nanometers.

Such quantum dots, wires or wells can be fabricated with electrical contact between individual ones of them, so that semiconductor devices such as diodes, transistors, photodetectors and light emitting devices can be made from them. There is the potential for sharp transitions between tunnelling and non-tunnelling (on and off) states in devices fabricated from quantum dots and quantum wires, so that quantum dot and quantum wire devices could be the building blocks for digital nano electronics, an integrated circuit technology which will permit downscaling to be carried beyond what is currently achievable.

In reality, the quantum dot or quantum wire device consists of a collection of particles each having a resonance cavity so small that quantum confinement effects are very pronounced. For the device to be effective, therefore, there must be a very high degree of size uniformity of the particles making up the quantum dot or quantum wire device, so that each has substantially identical electronic and optical properties.

BRIEF REFERENCE TO THE PRIOR ART

Previous techniques for making quantum dot devices include micro lithography. However, this technique does not produce quantum dots or wires in the desirable 10-100 nanometer range, and does not achieve the suitably high degree of size uniformity of the dots or wires. In other techniques, attempts have been made to cut grooves in crystals, in crisscross arrangement, but such techniques are impractical on the large scale, and too expensive for commercial operation.

Randall et al "*Advances in the Processing of Quantum Coupled Devices*" SPIE Volume 124 (1990) page 66, discusses the fabrication of isolated quantum dot diodes by heterostructure growth in a molecular beam epitaxial instrument, of semiconducting crystal materials such as gallium arsenide.

Van der Gaag et al SPIE Volume 1284 (1990) page 161, describes an electron beam lithography method for producing structures with lateral sizes smaller than the incident beam diameter. The patterns are then transferred into semiconductor quantum well heterostructures using chemically assisted ion beam etching, to form uniform arrays of pillars with lateral dimensions at or below 10 nanometers.

Scherer et al SPIE Volume 1284 (1990) page 149, describes the use of polymethylmethacrylate as both electron beam sensitive resist and ion etch mask for high resolution pattern transfer. Ultra-narrow gates with lateral dimensions below 20 nanometers are prepared by using high resolution electron beam lithography, chemically assisted ion beam etching, and in-situ metallization.

SUMMARY OF THE INVENTION

It is an object of the present invention to provide novel quantum dot and quantum wire devices.

It is another object of the present invention to provide a novel process for preparation of quantum dot and quantum wire devices.

The present invention provides a process for preparing quantum dot and quantum wire devices which involves the use of a metallic substrate having substantially parallel pores in the nanometer size range in its surface, to act as a template. The pores are filled with an appropriate metal, and then the surrounding surface layers of the substrate are etched away to expose the nanometer size range metal, rods, bound to the substrate. Then the rods can be chemically reacted, to form semiconductor materials. The end product is an array of quantum dots or quantum wires comprising nanometer size range rods, posts or cylinders of semiconductor material protruding in mutually parallel, closely spaced relationship, from a metal substrate, the rods being substantially uniform in size and substantially mutually parallel.

The invention also provides novel quantum dot and quantum wire devices in the form of an array of substantially mutually parallel, substantially uniform-diameter rods of semiconductor material protruding from an electrically conductive metallic base, each said rod having a diameter in the size range of from about 5 to 100 nanometers.

BRIEF REFERENCE TO THE DRAWINGS

FIGS. 1 and 2 of the accompanying drawings are graphical presentations of the results obtained according to Example 2 below.

DESCRIPTION OF THE PREFERRED EMBODIMENTS

Figure 1:
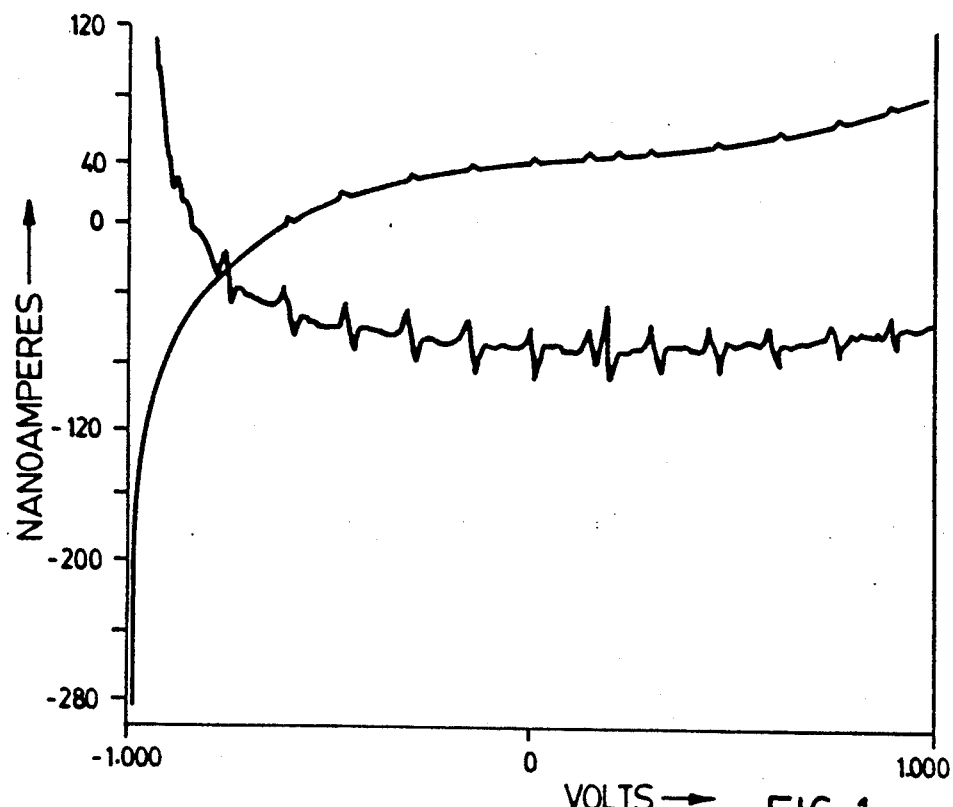

The metallic substrate which is used as the template for preparing semiconductors according to the present invention is normally aluminum or an aluminum alloy in which aluminum is the predominant metal, in foil or sheet form, having a surface layer of aluminum oxide thereon. It is produced by anodizing the metal sheet or foil. Firstly, the sheet or foil should be cleaned, ultrasonically and/or with organic solvent to remove grease residues from its surface. Then it is preferably washed with an alkaline chemical liquid so as to achieve a degree of surface etching, followed by neutralization to remove alkali excess. A wide variety of different chemical reagents may be used for these purposes. Sodium carbonate solution is an example of a suitable base with which to effect the etching. Nitric acid is a suitable neutralizing agent for subsequent use. Thus, the preferred cleaning process is ultrasonic cleaning in dichloromethane, followed by treatment with dilute sodium carbonate and then with dilute nitric acid. However, the cleaning process can be conducted with a very wide variety of different reagents.

Then the treated substrate is electrolytically anodized, for the purpose of depositing on the metal a porous surface layer of oxide. This anodizing is suitably accomplished by making the metal the anode of an electrolytic cell, using suitable (e.g. lead) counter-electrodes in an acid bath. Suitably, the bath is a relatively dilute solution of a strong acid such as sulphuric acid, phosphoric acid, oxalic acid or chromic acid. Direct current is passed through the cell between the electrodes, at a current or voltage suitably adjusted to provide the correct film deposition. This can be accomplished at room temperatures.

After suitable anodizing as described, the substrate is removed from the bath and rinsed. It is desirable to rid the surface of the treated substrate of residual acid, and neutralize it at this point. It is, however, undesirable to neutralize the acid chemically, since this might have the effect of damaging the deposited film. Accordingly, it is preferred to rinse the anodized film with suitable quantities of water to remove acid and effect appropriate neutralization.

A substrate so prepared has micro-pores in the oxide surface film, of substantially uniform size in the nanometer size range, and extending substantially perpendicularly from the metal substrate surface and therefore substantially parallel to one another. Accordingly, in the present invention, the so formed substrate acts as a template for preparing a quantum dot or quantum wire array. The pore diameters are fixed during the process of their preparation, so that the resulting diameters of the eventual semiconductor rods or posts are fixed accordingly. However, the depth of the pores can be adjusted by appropriate surface etching as described below, so that the length of the eventually formed semiconductor posts is similarly adjustable. Since the size confinement of the semiconductor material is thus in two or three dimensions, but not in only one dimension, the process of the invention is useful for making quantum dot and quantum wire devices, but does not lend itself to the preparation of quantum wells which require confinement in only one dimension.

Thus to make the semiconductors according to the preferred process of the invention, the pores are first filled with metal as the basis of the semiconductor material, followed by removal of the surrounding surface layers to expose the nanosized metal rods previously formed in the pores. It will thus be appreciated that the achievement of size and uniformity of the pores in the oxide layer is an important feature in the present invention. By the term "substantially uniform size" and equivalent expressions used herein, there is meant a standard deviation of not greater than 20% of the mean size of the items under consideration. This is a degree of uniformity readily achieved according to the process of the invention. It is preferred according to the invention to achieve a size uniformity wherein such standard deviation is not greater than 10% of the mean, a level which is achievable quite readily by careful control of the operating parameters of the process of the present invention and operation in accordance with the preferred embodiments thereof.

The pore diameter and the pore density achieved is determined to some extent by the choice of acid in the anodizing bath. Suitable acids from which to choose are phosphoric acid, oxalic acid, sulphuric acid and chromic acid. The use of phosphoric acid leads to the formation of relatively large pores. The use of oxalic acid or chromic acid leads towards the formation of smaller pores, while the use of sulfuric acid leads to the formation of pores of the smallest diameters. The relative concentration of the acid used also has a minor effect on the pore sizes produced, but this effect is of little significance in comparison with that derived from the choice of acid.

Pore density, i.e. the distance between individual pores in the substrate, can further be varied by choosing the DC anodizing voltage appropriately. High anodizing voltages lead to low pore densities, whilst low anodizing voltages tend towards the formation of films with high pore densities. The anodizing voltage has a lesser effect on the individual pore sizes.

After the anodizing process has been completed, the diameter of the pores can be further adjusted if desired by etching the oxide film with an appropriate acid medium. This diameter adjustment by subsequent acid treatment is not accompanied by any significant change in the depth of the pores, for some reasons not fully understood but probably due to the fact that the oxide film is anisotropic. With oxalic acid as the acid in the anodizing step, for example, at room temperature, one can create pores of approximately 12 nanometers diameter, and these can be enlarged controllably to diameters in excess of 150 nanometers, by etching in phosphoric acid or phosphorous acid.

In the preferred process of the invention, the next step is the deposition of metal into the uniform pores. This is suitably accomplished by immersing the previously anodized aluminum surface into an appropriate electrolyte containing the desired metal in anionic form, then applying alternating current between the aluminum and a suitable counter electrode such as graphite. The metallic particles eventually formed are faithful replicas of the interiors of the pores in the metallic oxide layer. There do not seem to be any surface effects or the like, inhibiting a true filling of the pores to the lower and side extremities thereof with deposited metal. Individual metallic deposits are initially formed within the pores, and grow from the bottom of the pores outwardly. The deposits eventually coalesce into compact metal rods, posts or cylinders, the length of which depends on the duration of the AC electrolysis process among other parameters. The compactness of the metal deposits, to improve their electronic characteristics by eliminating flaws and defects therein, may be further increased by annealing the materials so created in vacuum or under hydrogen. This may be done, for example, by heating to about 300° C. in a flow of 20% hydrogen/80% helium, at about 30cc/min.

When aluminum or gallium is the metal chosen for deposition, a non-aqueous electrolyte should be used for the electrodeposition step.

The metal chosen is, of course, one which is to form the basis of a semiconducting material. Most commonly, therefore, the deposited metal will be aluminum, indium, cadmium, zinc or gallium, but it may be any metal capable of forming a semiconductor after suitable chemical conversion. Mixed metal semiconductors may be created by depositing more than one metal, for example aluminum and gallium at the same time. Layered materials can be generated by sequentially depositing different metals, for example cadmium and zinc, ultimately to form different semiconductor layers within a given particle.

After suitably depositing the metal, the oxide matrix is partially or wholly peeled back by etching the oxide in an appropriate medium. To accomplish this, a medium or reagent is chosen which will attack the aluminum oxide surface layer, but will not attack the deposited metal in the pores to any significant extent or at anything approaching the same rate. A suitable and preferred choice is a solution of chromic and phosphoric acids. Preferably in this step, the aluminum substrate is left intact, eventually to act as an electrical connector between the individual quantum dot or quantum wire semiconductors. Advantage may be taken of the amphoteric properties of aluminum oxide for this purpose, and it is relatively easy to choose an acid which will selectively etch away the oxide whilst leaving the aluminum metal or alloy unaffected.

At this stage, a further adjustment in the size of the metallic rods eventually to form the semiconductors can be made, if desired. Now that the metal rods are exposed clear of the oxide substrate, they can be treated with a selectively reacting chemical reagent to etch the metal rods, so as further to reduce the size of the eventual semiconductors.

An alternative process step according to the present invention is to deposit a layer of conductive metal, e.g. gold, on the top surfaces of the deposited metal rods in the pores, and then etch away both the aluminum oxide surface layer and the aluminum metal substrate. This will lead to a similar end product in terms of physical structure, but an end product using a metal substrate for electrical conduction between the individual metal rods, e.g. gold, which can be chosen on the basis of optimum desired electrical characteristics and performance in the end product, not one dictated by chemical characteristics necessary for use in the preparation process.

When the aluminum substrate is left intact, it is likely that there exists an extremely thin deposit of aluminum oxide between the deposited metal and the aluminum metal substrate. This could have some influence on the electrical properties of the end product. However, since any such film will be the same for all the deposited metal rods and exert equal electrical influence over all of them, its presence is not significant.

When the oxide has been peeled back by etching in this manner, the nanosized metallic posts or cylinders are exposed, and these can be converted to a semiconductor by reaction with an appropriate liquid or gaseous reagent at a suitable temperature. In order to ensure full and uniform conversion to semiconductor of all the metallic posts of an array, such chemical reaction should be conducted to completion, allowing extra reaction time for this to occur if necessary. The particles of metal are so small that there is no significant difficulty in conducting solid state reactions with them to completion.

For example, cadmium particles can be converted to cadmium sulphide semiconductor by reaction with sulphur vapour or with hydrogen sulphide. Gallium particles can be converted to gallium arsenide by reaction with arsine. Moreover, at this stage a further adjustment can be made to the size of the semiconductor posts by etching the semiconductor in a suitable, selectively reacting acid.

The conducting of the necessary chemical processes to convert the metal posts to semiconductors does not cause any significant detachment of the metallic posts from their substrate. Likewise, if a very small amount of unreacted metal remains at the junction of the semiconductor rod to the metal substrate or residual oxide layer thereat, the electronic characteristics of the final product will, in many cases, not be adversely affected.

Doped semiconductors and P-N junctions can also be produced by the process of the present invention, by depositing small amounts of the desired impurity at the bottom of the pore before metal deposition. Alternatively, or in addition, an appropriate impurity can be deposited on the upward tips of the semiconductor particles, and then allowed to diffuse at elevated temperatures under vacuum. Metal electrodes may be vapour deposited across the tips of the semiconductor particles to form appropriate electrical contacts or Schottky junctions.

By the process of the present invention, semiconductor quantum dots and quantum wires in the diameter size range below 500 nanometers are easily achieved. As described above, the length of the rods is largely a matter of choice, based upon pore depth created and subsequent etching of the deposited metal. Rod lengths of the same sizes as the diameters thereof can be obtained without undue difficulty. The process of the present invention is capable of producing rods of diameter 1-500 nanometers, but is preferably used to make semiconductor rods of diameter 5-250 nanometers, and most preferably of diameter 10-100 nanometers. Semiconductor materials of such very small dimensions are novel products, and constitute a major aspect of the present invention.

By the process of the present invention, one can make the materials on a relatively large scale, using aluminum sheet or foil substrate, and cut them to the appropriate sizes for use in microelectronic devices, for example in areas of about one square mm. Over such size area ranges, the uniformity in size of the pores and hence the resulting semiconductor rods is extremely high.

The invention is further described with reference to the following specific examples.

EXAMPLE 1

Four semiconductor devices were made by the most preferred process of the present invention. In the first, preliminary step, four samples of super-purity aluminum (99.99%) were degreased ultrasonically in trichloroethylene for approximately 30 minutes. Then the samples were washed and surface etched in aqueous sodium carbonate solution (25 g/liter) at approximately 85° C. for one minute, neutralized in a 1:1 (v/v) aqueous nitric acid solution for 20 seconds and rinsed in distilled water.

In the second step, three of the samples were anodized in 4% (by volume) phosphoric acid solution at 24° C. using the following conditions:

| Sample | Anodizing voltage (volts) | Time (mins) |
| --- | --- | --- |
| 1 | 54 | 60 |
| 2 | 54 | 30 |

-continued

| Sample | Anodizing voltage (volts) | Time (mins) |
| --- | --- | --- |
| 4 | 35 | 30 |

Sample 3 was first anodized in 0.4M sulphuric acid at 50° C. for 10 minutes at 25 volts, then in 4% phosphoric acid for 30 minutes at 15 volts. Anodization in each case was carried out with high purity lead foil cathodes.

In the third step, the surface pores created by anodizing the samples were conditioned in 0.1M phosphoric acid at 22° C. for the following periods of time:

| Sample | Conditioning Time (mins) | Predicted Pore Diameter (nm) |
| --- | --- | --- |
| 1 | 25 | 45 |
| 2 | 18 | 45 |
| 3 | 0 | 34 |
| 4 | 18 | 45 |

In the fourth step, cadmium metal was deposited in the pores from an electrolyte constituted by 72 g of cadmium sulphate and 30 g of boric acid made up to 900 ml of aqueous solution with distilled water. AC electrolysis was used to deposit metal using graphite counter-electrodes, and 16 volts RMS of 200 Hz sine wave between the aluminum sample and the graphite electrode. Electrolysis time in each case was 5 mins at room temperature (20°-23° C.).

Next, the cadmium deposits, which were in the form of rods filling the pores tightly but to varying heights, were made uniform in height by etching briefly in an etching solution consisting of 0.47M phosphoric acid and 0.2M chromic acid, at 85° C. for 25 seconds, to expose the tips of the cadmium deposits, then wiped clean with silica-impregnated tissue.

At this point in the procedure, an anodic oxide film and cadmium metal deposited in the pores thereof covered both sides of the aluminum substrate. In order to expose a fresh aluminum surface for use as one of the electrical contacts in the final device, therefore, one side of the oxide/cadmium deposit was removed. This was accomplished by protecting one side, carrying the deposit, with a clear polymer solution in acetone (nail polish), then etching the exposed side with the above phosphoric/chromic etchant for 10 minutes at 85° C. The protective polymer film was then dissolved away in acetone to expose the cadmium rods embedded in the aluminum oxide film.

Then a portion of the aluminum oxide film was etched away by dipping the samples in the above described phosphoric/chromic etchant, for 10 seconds, to leave at least a part of the cadmium rods exposed. To convert these rods to semiconductor cadmium sulphide, the samples were placed in a glass tube and connected to a vacuum system. The air was evacuated from the tube and the samples heated to 300° C. in the presence of sulphur vapour above solid sulphur freshly sublimed onto a portion of the inner wall of the glass tube from previously degassed sulphur contained in a side tube.

The samples were verified to be CdS using Dispersive X-ray analysis and Raman spectroscopy. The two techniques indicated that the cadmium was substantially all converted to cadmium sulphide and that there was no excess solid sulphur. Scanning electron microscopic images of the top surfaces of the samples were also recorded and indicated the presence of uniform rods with spheroidal tips having dimensions in the 60-100 nm range.

EXAMPLE 2

The procedure described above was repeated except that oxalic acid, at the same concentration, was used as the anodizing solution instead of phosphoric acid. Films with smaller pore sizes were thus obtained. Measurements of pore diameters after anodizing for one hour indicated that in all cases a pore size diameter within 25% of that predicted, and in most cases within 10% of that predicted, could be obtained. Oxide film thicknesses from 2.25 to 2.75 microns were obtained, with pore diameters ranging from 15 to 38 nanometers, depending upon the anodizing conditions and times chosen. Cadmium deposit into the pores, etching of the aluminum oxide film, and conversion of the cadmium to semiconductive admium sulphide was undertaken as in Example 1.

A circular gold electrode, approximately ½ cm in diameter, was then deposited by vacuum sputtering onto the CdS rods so formed, and electrodes were attached with electrically conducting adhesive to the gold electrode and the aluminum substrate. Current was passed through the device and measured as a function of voltage, using a Hewlett Packard apparatus.

The results are presented graphically in FIG. 1. On curve A, a voltage range of from −1.000 volts to +1.000 volts is plotted as the abscissa, and the current passing through the device on application of the changing voltage to the device, in nanoamperes, is plotted as the ordinate. The curve is obtained by sweeping through the voltage range. The results show that the current/voltage characteristics are dominated by the capacitance of the device. Periodic current "spikes" are observable thereon. Curve B on FIG. 1 is a first derivative of curve A, i.e. the conductivity curve derived therefrom and showing the rate of change of current versus voltage. This more clearly demonstrates the existence of these current "spikes". These indicate, without doubt, the effect of quantum confinement on the properties of the device.

Figure 2:
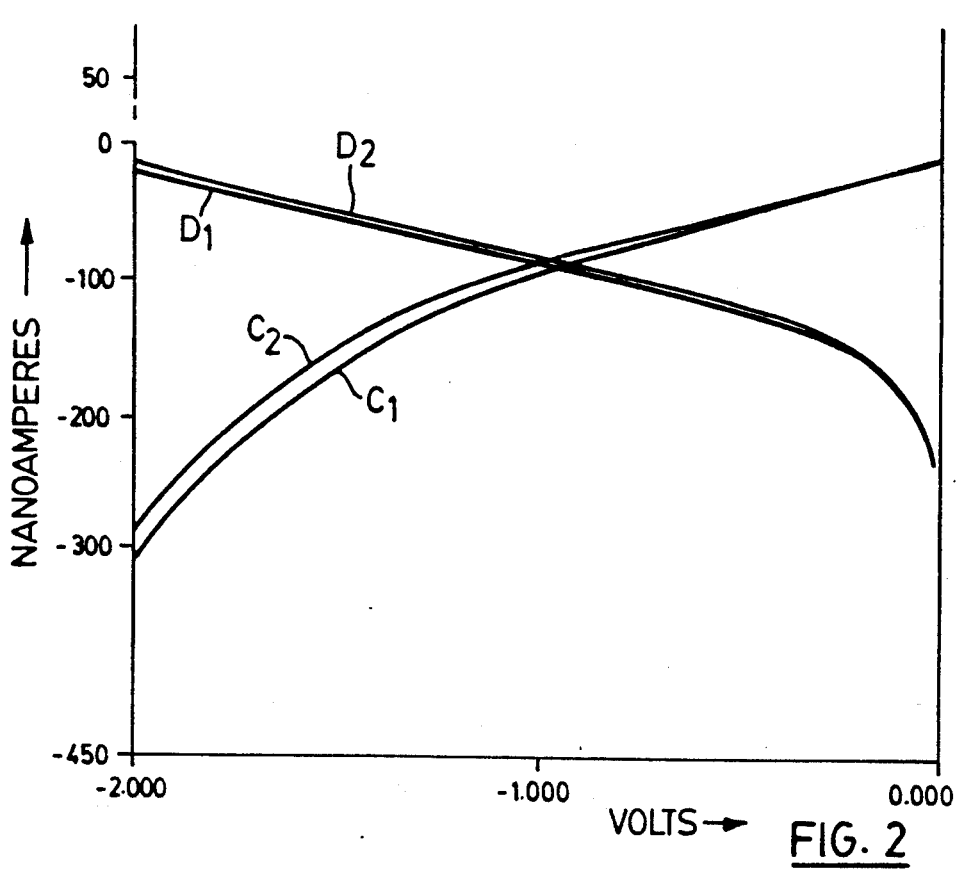

FIG. 2 shows two pairs of curves of voltage against current for the device, similar to curve A of FIG. 1, but generated over a different voltage range (−2.000 volts to 0.000 volts). Curves $C_1$ and $C_2$ are generated starting at −2 volts and proceeding to 0 volts, whereas curves $D_1$ and $D_2$ are generated by sweeping in the opposite direction. Curves $C_1$ and $D_1$ are curves of current versus voltage obtained with the device in the dark. Curves $C_2$ and $D_2$ were obtained while the device was illuminated with a 40 W microscope lamp. The increased current obtained with the device illuminated demonstrates that it is light sensitive and potentially useful as a light detector.

I claim:
1. A process for preparing nanosized quantum dot or quantum wire semiconductors in the form of an array of substantially mutually parallel, substantially uniform-sized rods of semiconducting material, said process comprising the steps of:

providing an aluminum or aluminum alloy substrate in sheet or foil form;

anodizing said substrate electrolytically in an acid bath, to deposit thereon an oxide film having micropores of substantially mutually parallel axial disposition and substantially uniform diameter in the range from about 1 to about 500 nanometers;

electrolytically depositing in said pores at least one metal capable of forming a semiconductor material on appropriate chemical reaction;

etching away at least a portion of said oxide film from the substrate surface to expose at least a portion of the deposited metal;

and chemically reacting the exposed metal with a gaseous or liquid chemical reactant to form a semiconductor compound therefrom.

2. The process of claim 1 wherein the substrate is anodized in a dilute solution of strong acid.

3. The process of claim 2 wherein the strong acid is sulphuric acid, phosphoric acid, oxalic acid, chromic acid or a mixture of two or more of such strong acids.

4. The process of claim 1 wherein the metal capable of forming the semiconductor material is aluminum, cadmium, indium, gallium or zinc.

5. The process of claim 4 wherein the metal is annealed after deposition in the pores of the oxide layer.

6. The process of claim 1 wherein the metal capable of forming the semiconductor is aluminum or gallium, and is deposited into the pores from a non-aqueous electrolyte.

7. The process of claim 1 wherein, after deposition of the metal, the oxide film is etched away with an acid.

8. The process of claim 7 wherein the aluminum or aluminum alloy metal substrate is left substantially intact whilst the oxide film is etched.

9. The process of claim 8 wherein the acid etchant is a mixture of phosphoric acid and chromic acid.

10. The process of claim 1 wherein the chemical treatment of the exposed metal is conducted to completion.

11. The process of claim 10 wherein the exposed metal for the semiconductor material is cadmium and the chemical treatment is with gaseous sulphur or hydrogen sulphide, to form semiconducting cadmium sulphide.

12. The process of claim 10 wherein the exposed metal for the semiconductor material is gallium and the chemical treatment is with arsine, to form semiconducting gallium arside.

13. The process of claim 7 including the additional steps of depositing a conductive metal film on the exposed ends of the metal rods, and etching away the aluminum or aluminum alloy metallic substrate.

14. The process of claim 13 wherein the conductive metal film is a gold film.

* * * * *